(12) United States Patent (10) Patent No.: US 8,115,508 B2
Bucossi et al. (45) Date of Patent: *Feb. 14, 2012

(54) STRUCTURE FOR TIME BASED DRIVER OUTPUT TRANSITION (SLEW) RATE COMPENSATION

(75) Inventors: William L. Bucossi, Burlington, VT (US); Albert A. DeBrita, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 872 days.

This patent is subject to a terminal disclaimer.

(21) Appl. No.: 12/053,946

(22) Filed: Mar. 24, 2008

(65) Prior Publication Data

US 2008/0216033 A1 Sep. 4, 2008

Related U.S. Application Data

(63) Continuation-in-part of application No. 11/621,248, filed on Jan. 9, 2007, now Pat. No. 7,432,730.

(51) Int. Cl.
*H03K 17/16* (2006.01)
(52) U.S. Cl. ............... 326/26; 326/21; 326/27; 326/29; 327/108
(58) Field of Classification Search .................. None
See application file for complete search history.

(56) References Cited

U.S. PATENT DOCUMENTS

| | | | |
|---|---|---|---|
| 5,013,940 A | 5/1991 | Ansel | |
| 5,568,081 A | 10/1996 | Lui et al. | |
| 6,069,509 A | 5/2000 | Labram | |
| 6,229,336 B1 | 5/2001 | Felton et al. | |
| 6,288,563 B1 | 9/2001 | Muljono et al. | |
| 6,483,354 B1 | 11/2002 | Gasparik | |
| 6,548,991 B1 | 4/2003 | Maksimovic et al. | |
| 6,664,834 B2 | 12/2003 | Nair et al. | |
| 6,670,821 B2 | 12/2003 | Ajit | |

(Continued)

OTHER PUBLICATIONS

"Tutorial—Cadence Design Environment", by Antonio J. Lopez Martin, Klipsch School of Electrical and Computer Engineering, New Mexico State University, http://www.ece.nmsu.edu/vlsi/cadence/CADENCE%20Manual.pdf, Oct. 2002.*

(Continued)

*Primary Examiner* — Shawki S Ismail
*Assistant Examiner* — Jany Tran
(74) *Attorney, Agent, or Firm* — David Cane; Roberts Mlotkowski Safran & Cole, P.C.

(57) ABSTRACT

A design structure and more particularly to a design structure to minimize driver output slew rate variation. The design structure is embodied in a machine readable medium for designing, manufacturing, or testing an integrated circuit. The design structure includes a driver circuit having an input signal and an output signal, where the driver circuit is structured and arranged to control the slew rate of the output signal. A delay circuit is coupled to an output of the driver circuit, where the delay circuit has a delay proportional to a desired target slew rate of the driver output signal. A first comparator for detecting when the driver output signal rises through a specified level, and a second comparator for detecting when the driver output falls through a second specified level are included. A phase detector is coupled to outputs of the first and second comparators and an output of the delay circuit for aligning the phases (voltage-time relationships) of the comparator outputs and the delayed comparator outputs by adjusting the driver output slew rate.

20 Claims, 9 Drawing Sheets

U.S. PATENT DOCUMENTS

| | | |
|---|---|---|
| 6,842,058 B2 | 1/2005 | McNitt et al. |
| 6,844,755 B2 | 1/2005 | Ajit |
| 7,148,725 B1 | 12/2006 | Chan et al. |
| 2003/0042953 A1 | 3/2003 | Shin |
| 2004/0068711 A1* | 4/2004 | Gupta et al. .................... 716/18 |
| 2005/0195005 A1 | 9/2005 | Choi et al. |
| 2005/0285646 A1 | 12/2005 | Rashid |
| 2006/0197568 A1 | 9/2006 | Takagi |

OTHER PUBLICATIONS

Notice of Allowance for corresponding U.S. Appl. No. 12/178,245, Mailed Apr. 19, 2010.

* cited by examiner

STRUCTURE FOR TIME BASED DRIVER OUTPUT TRANSITION (SLEW) RATE COMPENSATION

CROSS REFERENCE TO RELATED APPLICATIONS

The present application is a continuation-in-part of application Ser. No. 11/621,248, filed on Jan. 9, 2007 now U.S. Pat. No. 7,432,730, the contents of which are incorporated by reference in their entirety herein.

FIELD OF THE INVENTION

The invention generally relates a design structure and more particularly to a design structure to minimize driver output slew rate variation.

BACKGROUND OF INVENTION

Many of today's I/O driver specifications require very small output slew rate variation; particularly specifications for multi-I/O busses. Through network analysis, an optimal output edge rate can be determined to minimize Inter Symbol Interference (ISI) and signal propagation time, and thereby increase the maximum operating frequency of the system. Deviating from this optimal edge rate typically has unfavorable timing and signal integrity implications.

As is known among I/O and System designers, driver output slew rate variation is primarily a function of the driver circuit topology, varying operating conditions, such as voltage and temperature, silicon process variation and the particular application load network. As higher operating frequencies and stricter timing requirements have forced tighter output slew variation specifications, it has become necessary to actively compensate the driver to comply with these specifications and system requirements. Moreover, this class of timing and signal integrity problems will become even more pronounced in the future as both buss operating frequencies and silicon device parametric variations are expected to increase.

Current state of the art techniques to control slew rate variation utilize a concept known as "Process/voltage/temperature (PVT) Correlation." The design engineer analyzes a circuit to determine the sensitivities and effect of PVT variation on a parameter of interest. In this situation, the parameter of interest is driver output slew rate. Once sensitivities have been determined, a reference circuit is designed such that an easily measurable variable, e.g., impedance, is affected by PVT variation in a manner that correlates reasonably well to the driver output slew rate. For example, assuming analysis shows the process variation of nFET transconductance has the largest, albeit not the only, effect on output slew rate, a sensing circuit would be designed to compare the transconductance of sample nFETs to an ideal reference in order to compensate the driver. However, first order parametric correlation is far from perfect and second relationships are completely ignored. Further, as the reference circuit is much less complex than the compensated circuit and measures a DC variable parameter to compensate a quasi-related AC variable parameter, the compensation is not optimum.

Operation of the suboptimum system works as follows. If the relative strength of the pull down is weak, the comparison of the voltage divider to the reference signal will present a logic '1' to the controller which will in turn enable additional PVTx bits, adding nFET "fingers" and increasing the effective strength of the pull down. Conversely, if the relative strength of the pull down is strong, the comparison of the voltage divider to the reference signal will present a logic '0' to the controller which will in turn disable additional PVTx bits, subtracting NFET "fingers" and decreasing the effective strength of the pull down. This process iterates until the voltage divider signal is equal to the reference voltage.

As discussed above, today's specifications require tight slew rate variation such that a reference circuit must be designed with DC sensitivity to PVT variation that closely mimics that of driver slew rate variation. Using these correlative techniques renders this task virtually impossible with the required degree of accuracy. Other deficiencies in this technique arise in that only one or two reference circuits are used to determine the PVT bit settings for potentially hundreds of drivers across the chip completely ignoring output slew variation caused by across chip, load and local power supply variation.

SUMMARY OF THE INVENTION

According to an aspect of the invention, the invention is directed to a design structure embodied in a machine readable medium for designing, manufacturing, or testing an integrated circuit. The design structure includes a driver circuit having an input signal and an output signal, where the driver circuit is structured and arranged to control the slew rate of the output signal. A delay circuit is coupled to an output of the driver circuit, where the delay circuit has a delay proportional to a desired target slew rate of the driver output signal. A first comparator for detecting when the driver output signal rises through a specified level, and a second comparator for detecting when the driver output falls through a second specified level are included. A phase detector is coupled to outputs of the first and second comparators and an output of the delay circuit for aligning the phases (voltage-time relationships) of the comparator outputs and the delayed comparator outputs by adjusting the driver output slew rate.

According to another aspect, the invention is directed to a design structure embodied in a machine readable medium for designing, manufacturing, or testing an integrated circuit. The design structure includes a delay circuit connectable to an output of the driver circuit, where the delay circuit is tunable to establish a time reference. The design structure also includes a device to measure the transition rate for the rising and falling edges of the driver output signal, a device to compare the measured transition rate to the time reference, and a control device structured and arranged to control an output slew rate of the driver.

DETAILED DESCRIPTION OF EMBODIMENTS OF THE INVENTION

The invention is directed to a design structure to effectively minimize driver output slew rate variation. In accordance with the invention, the slew of each driver can be directly measured and controlled.

While the prior art PVT Correlation technique discussed above provides a certain degree of output slew rate compensation, it has been demonstrated in practice that when tight tolerances are required, this technique simply cannot deliver the required accuracy. The inventors have found that the major flaw in the correlation technique is that the parameter of interest, driver output slew rate, is indirectly compensated instead of actually being both measured and controlled directly. According to the invention, the controlled parameter is the measured parameter, and the control of the parameter requires a near perfect reference and measurement technique.

Figure 1:
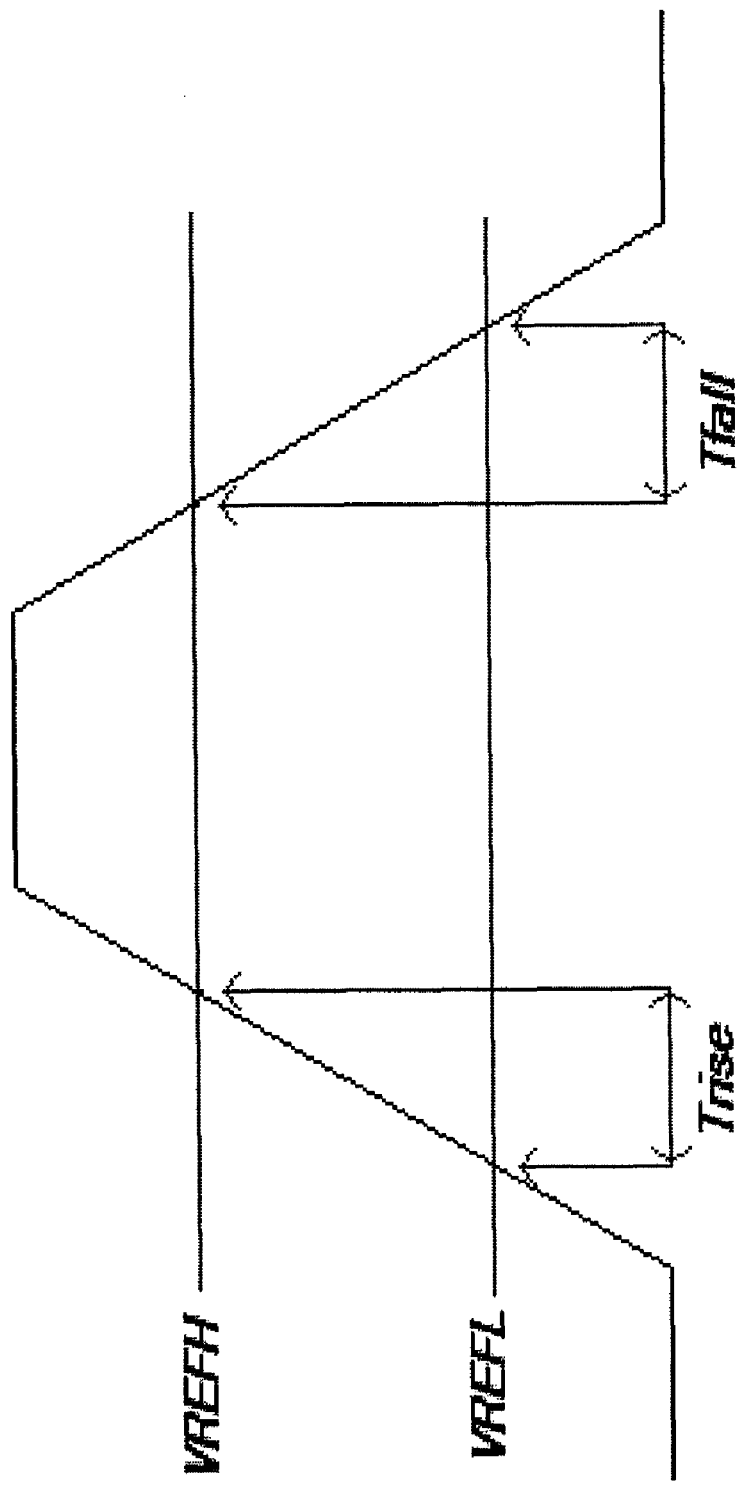
FIG. 1 graphically illustrates the rise/fall slew parameters of interest according to aspects of the invention.

In accordance with the invention, a circuit is provided to implement the technique to sample/measure, compare and control driver output rise/fall time. In this regard, FIG. 1 graphically depicts the rise/fall slew rate of a driver's output. The driver output rise/fall slew has unit of volts/time, and, in accordance with the invention there are three components of interest: a high reference voltage VREFH, a low reference voltage VREFL, and the time for the signal to transition between those two points Trise and Tfall. As shown in FIG. 1, when the high and low references VREFH and VREFL are accurately fixed, transition time becomes the only measured variable. Further, to control transition time according to the invention, it is particularly advantageous to include an accurate time reference, an accurate driver output transition time measurement, an accurate comparison of the measured transition time to a time reference, and a controlled compensation of the driver using a direct feedback technique.

Figure 2:
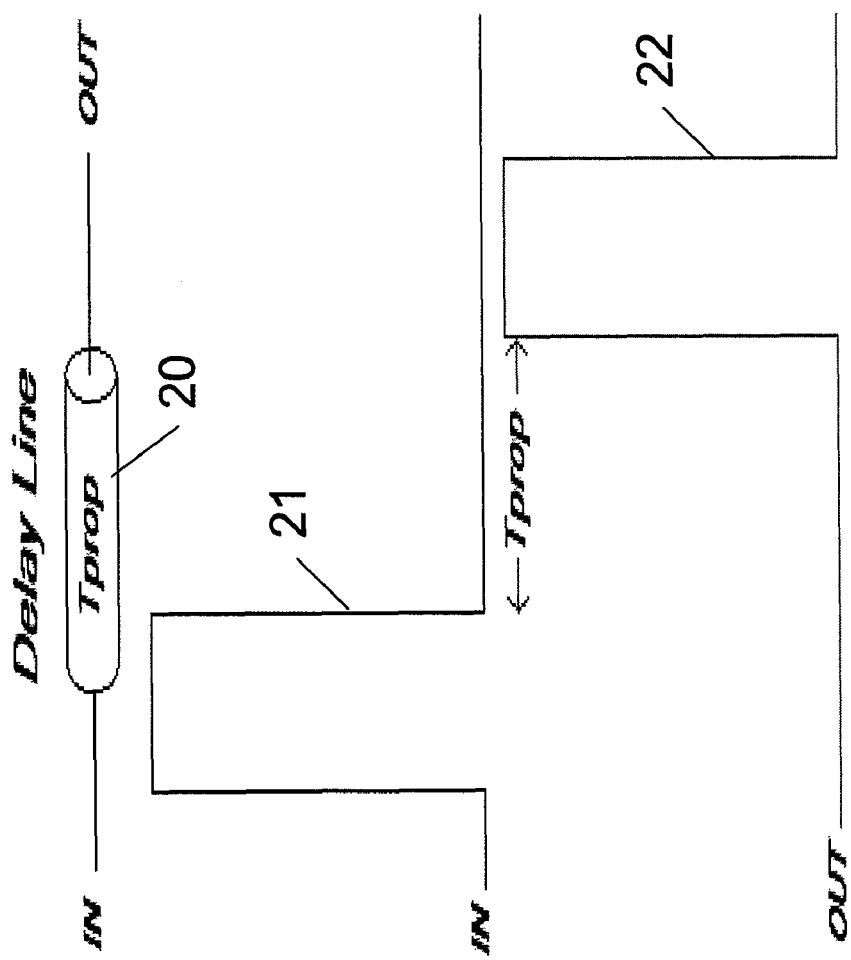
FIG. 2 schematically illustrates an accurate time reference in accordance with the invention.

An accurate time reference in accordance with the invention is schematically illustrated in FIG. 2. As shown, a Delay Lock Loop (DLL) with a delay line 20 can be used to provide a virtually PVT independent time reference. The DLL is advantageous in that it is a self-compensating circuit. As shown in FIG. 2, the duration of pulse 21 of the signal IN corresponds to the desired rise time of the driver output and the duration of pulse 22 of the signal OUT corresponds to the desired fall time of the driver output, both of which correspond to the propagation delay through the DLL. The specifics of DLL design are generally known, such that no further disclosure of DLL design is necessary. Delay line 20 of the invention is tunable such that the propagation delay time Tprop through the DLL is selected to equal or exactly match the desired transition time for the driver output rise/fall.

As an example, if a required transition rate for the driver output rise/fall is 1V/ns and difference between the predefined high and low voltage references is 1V, i.e., VREFH−VREFL=1V, then the required Trise/fall=1 ns. In this instance, delay line 20 would be tuned so the propagation time through the DLL is 1 ns, i.e., Tprop=1 ns.

Figure 3:
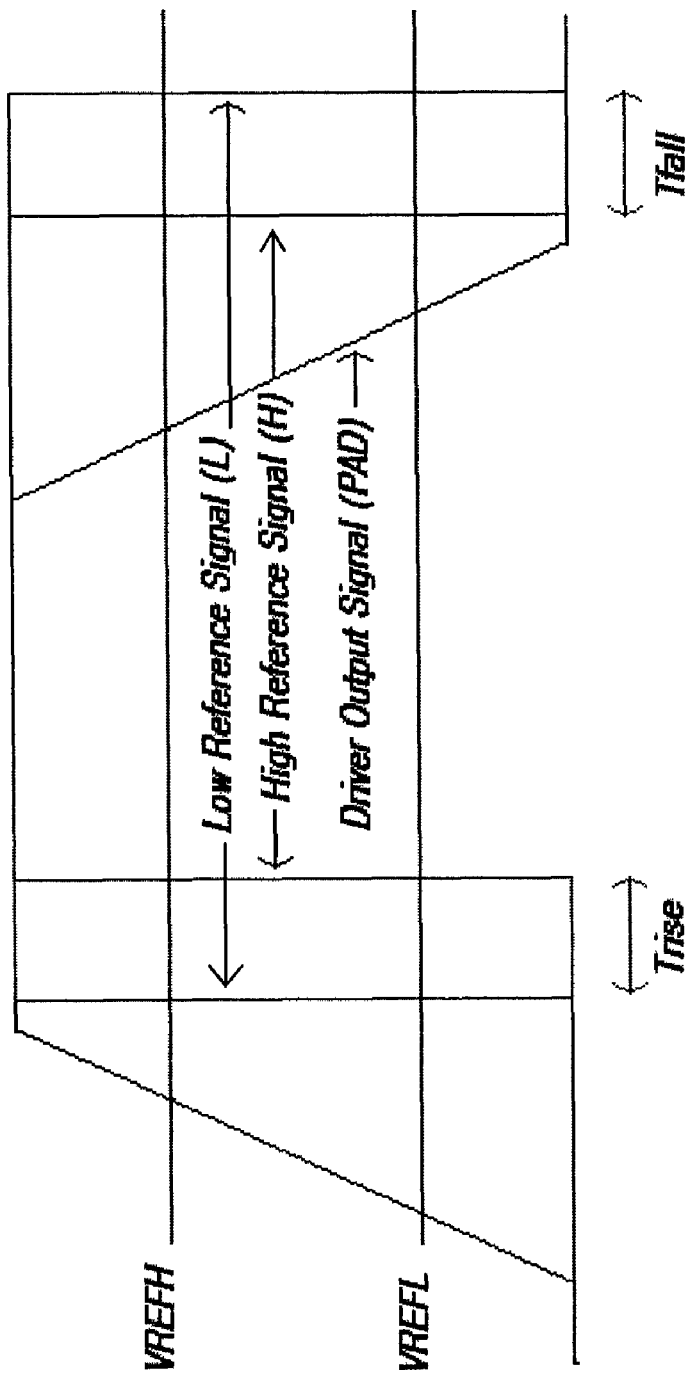
FIG. 3 graphically illustrates an accurate driver output transition time measurement.

It is further advantageous to perform an accurate driver output transition time measurement. As discussed above, an analog signal can be generated that contains transition rate information represented entirely by the duration or width of the pulse. Thus, it is possible to construct an individual signal whose pulse width is equal to the rise and fall time. As shown in FIG. 3, signals L and H capture the PAD transition times through voltage references VREFH and VREFL. The rise/fall time information is stored in the time difference between the edges of signals L and H. The absolute position in time of signals L and H is of little consequence as long as the latency through both comparators is matched. Further, minimizing the magnitude of the latency, e.g., through comparators (discussed below), reduces the effect of delay mismatching on the accuracy of the measurement.

Figure 4:
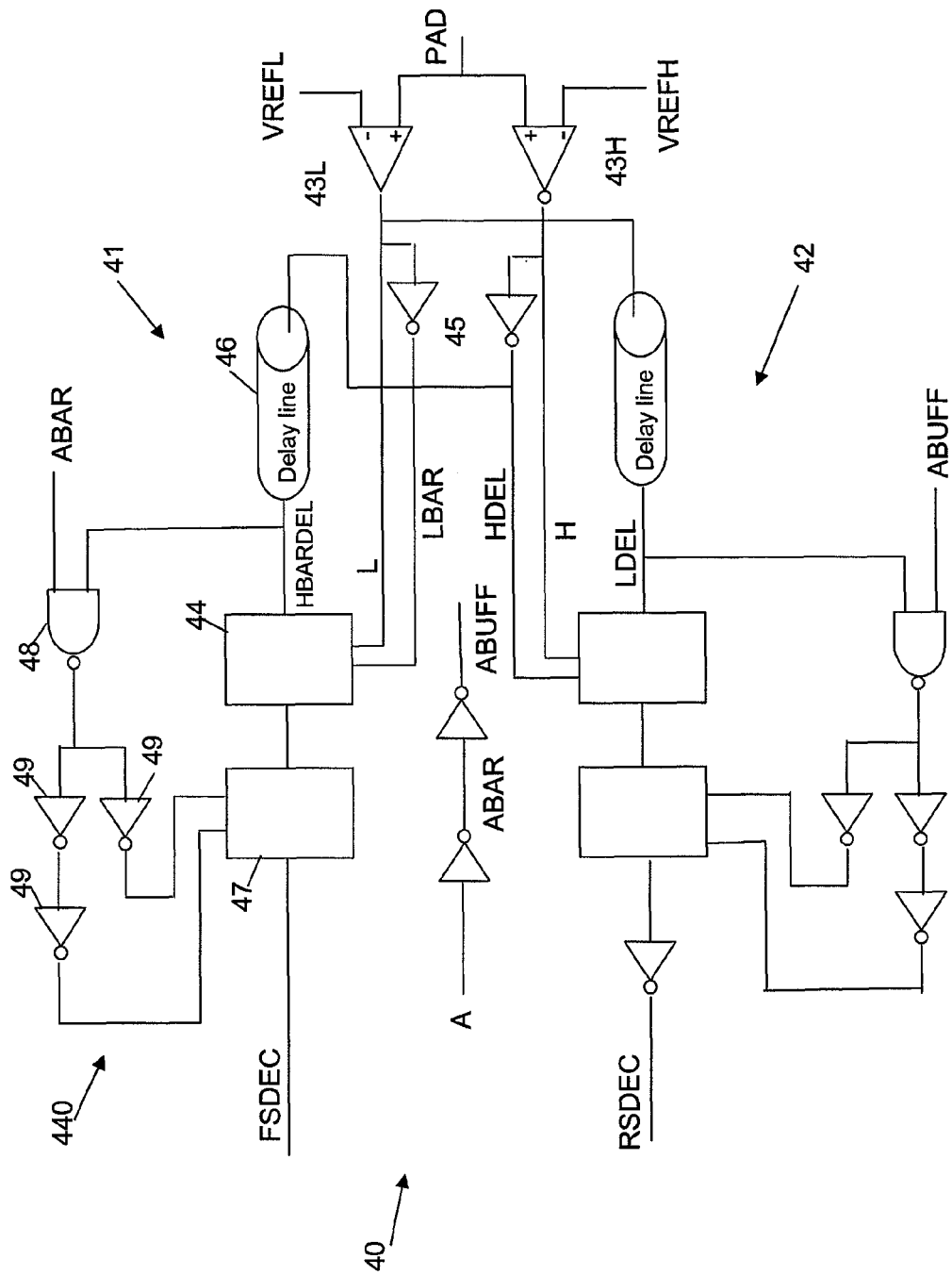
FIG. 4 illustrates a circuit for determining an accurate comparison of the measured transition time to the time reference.

A circuit 40 for determining an accurate comparison of the measured transition time to the time reference is illustrated in FIG. 4. This circuit is used to measure the rising and falling transition times, compare the measured transition times to the delay line time reference (i.e., Tprop) and develop digital error signals representing the results of the comparison. In an effort to simplify explanation of the invention, only the operation of the circuit 41 for comparing the falling edge waveform will be discussed in detail. Operation of the circuit 42 for comparison of the rising edge waveform is identical in principle to the falling edge comparison circuit.

The circuitry and waveforms for the falling edge comparison utilize the upper half of the circuit depicted in FIG. 4. The circuit utilizes the signal L, the inverse of signal L (LBAR) and the inverse of signal H after the delay line (HBARDEL) to determine the logical state of digital error signal FSDEC. At the input to circuit 40, a PAD signal is connected to the "+" input of operational amplifier 43L, while the "−" input of operational amplifier 43L is coupled to low voltage reference VREFL in order to determine (in time) the pad transition through each reference signal (level). Thus, the falling transition of signal L is triggered by the falling transition of PAD through voltage reference VREFL. Further, the PAD signal is connected to the "+" input of operational amplifier 43H, while the "−" input of operational amplifier 43H is connected to high voltage reference VREFH in order to determine (in time) the pad transition through each reference signal (level). The output of operational amplifier 43L generates signal L, which is input into a latch element 44 of a phase detector 440, and signal L is likewise inverted by inverter 45 to generate signal LBAR, which is also input into latch element 44 of phase detector 440. The output of operational amplifier 43H generates signal HBAR, which is input into delay line 46 to generate the signal HBARDEL, delayed by an amount equal to Tprop, which is the propagation delay through the delay line. As a result, the rising transition of signal HBARDEL is triggered by the falling transition of PAD through voltage reference VREFH. Signal HBARDEL is input into latch element 44. Similarly, in circuit 42 which compares the rising edge waveform, signal LBAR is the input to the delay line to form LBARDEL, which is delayed by an amount equal to Tprop.

Phase detector 440 is composed of latch elements 44 and 47, as well as elements 49 and 48, which form edge selection circuitry. The combination of these circuits creates a phase detector triggered by the falling edge of the driver data input. The result of the phase comparison (provided by the phase detector) is used to compensate the driver and eventually phase aligns signals HBARDEL and L, reducing the phase error to zero.

Thus, when signal L is phase aligned with signal HBARDEL, the falling transition time is equal to Tprop and the driver output transition rate has been successfully compensated.

Phase detector 440 provides a falling edge triggered digital error signal FSDEC that is the result of a comparison between time Tfall and the ideal reference transition time. Further, in order to sample the proper edge, a NAND gate 48 is arranged to receive HBARDEL and ABAR, where signal A is the data input signal to the driver, and ABAR is the inverse of signal A.

The output of NAND gate 48 passes through various buffers 49 to align enable signals in order to produce the error signal at the output of the phase detector. Similarly, in circuit 42, the inputs to the NAND gate, i.e., LBARDEL and ABUFF are used for comparing the rising edge waveform, where ABUFF is a buffered version of driver data input signal A.

If the falling edge transition of signal L occurs after the rising edge transition of HBARDEL, signal FSDEC will transition to logic "1", indicating a need for the feedback system to increase the falling edge PAD transition rate. If the falling edge transition of signal L occurs slightly before the rising edge of signal HBARDEL, signal FSDEC will transition to logic '0' indicating a need for the feedback system to decrease the falling edge transition rate. When the driver output fall time has been adjusted to match Tprop, FSDEC will switch between logic "1" and "0" on subsequent PAD transitions. This repetitive switching behavior of FSDEC is a clear indicator that the system has converged on the target PAD falling edge transition rate.

Figure 5:
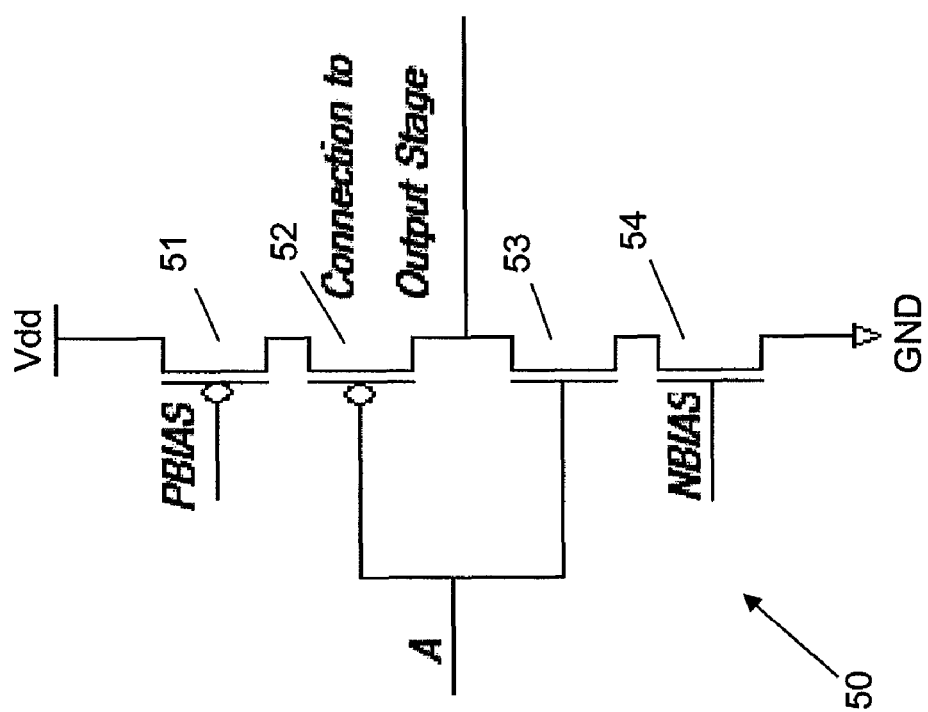
FIG. 5 illustrates the controlled compensation of the driver.

Following the comparison of the measured transition time to the time reference, an adjustment of the driver, controlling the driver output slew rate, is effected. Through simulation, it has been determined the driver output slew rate is strongly related to the slew rate of the previous stage, typically called the pre-drive stage. In fact, a near perfect correlation between driver output edge rate and the edge rate of the pre-drive has been observed in practice. A preferred method to control the strength or slew rate of the pre-drive stage, uses an analog circuit approach. By controlling the current through the pre-drive stage using a "Current Limited Inverter" scheme, as depicted in FIG. 5, the output slew can effectively be controlled. The current limited inverter 50 is formed by a pair of pFETs 51 and 52 coupled to a pair of nFETs 53 and 54. The FETs are arranged in series between Vdd and ground, and a connection to an output stage is taken from the common drain node between pFET 52 and nFET 53. The gates of pFET 52 and nFET 53 are coupled to the driver input signal A. The gates of pFET 51 and nFET 54 are coupled to bias signals PBIAS and NBIAS, respectively, therefore pFET 51 and nFET 54 act as current sources. The bias signals (PBIAS and NBIAS) are generated by charge pumps (discussed below) to control the pFET and nFET current sources, thereby limiting the current through the pre-drive. Further, the charge pumps convert the digital error signals FSDEC and RSDEC resulting from the time comparison into analog signals PBIAS and NBIAS.

Figure 6:
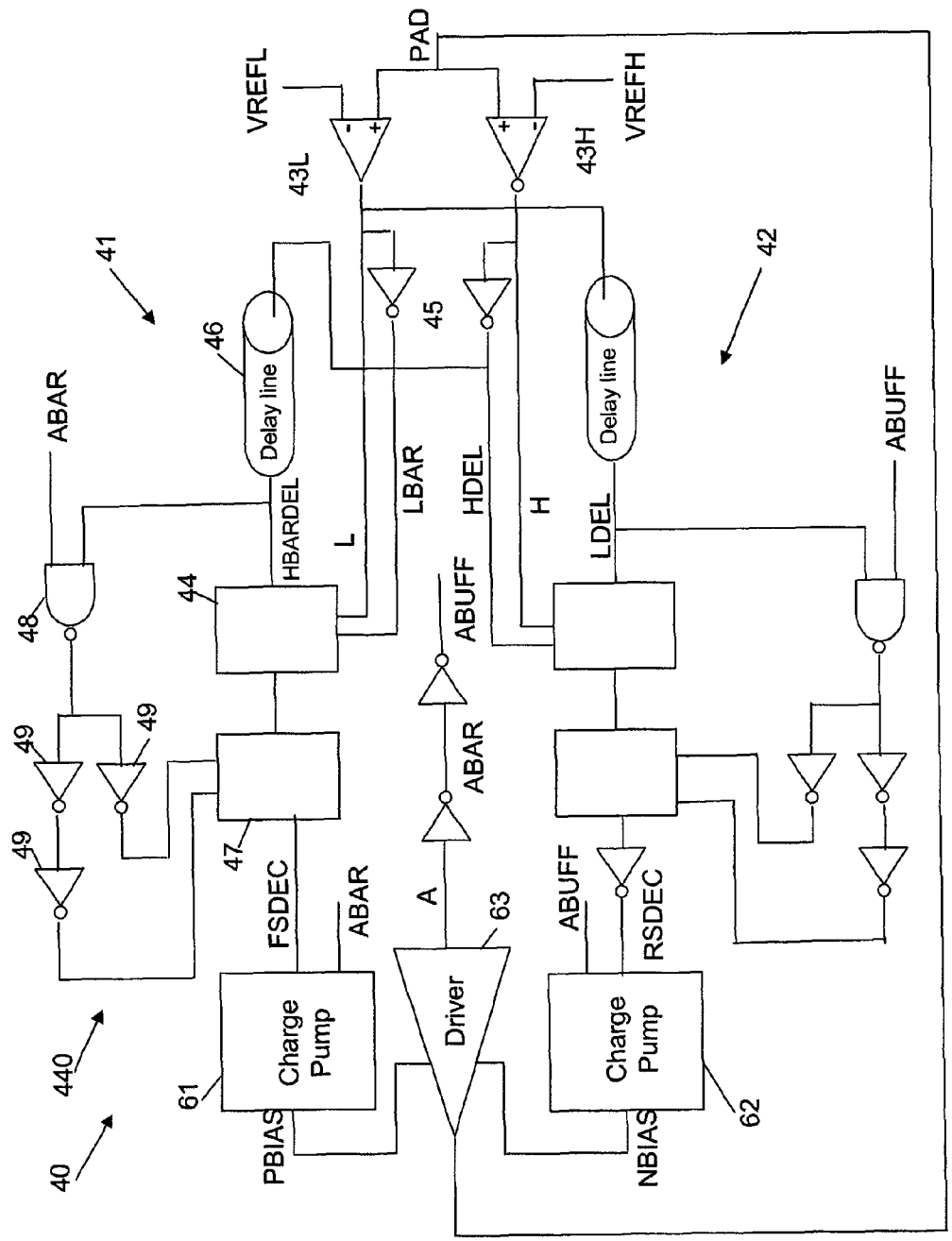
FIG. 6 illustrates a driver coupled through charge pumps to the circuit depicted in FIG. 4.

FIG. 6 illustrates the digital error signals FSDEC and RSDEC (output from circuit 40) that initiate accurate comparison of the measured transition time to the time reference depicted in FIG. 4. FSDEC and RSDEC are coupled to charge pumps 61 and 62, respectively. Charge pumps 61 and 62 utilize a typical bang-bang circuit topology to supply current pulses with fixed total charge. A separate charge pump is provided for each of two edge measurements. As discussed above, the PBIAS and NBIAS signals generated by charge pumps 61 and 62, are coupled to driver 63 to control the output slew rate. Charge pumps 61 and 62 have two inputs (clock, decrement) and one analog output voltage (PBIAS or NBIAS). The driver data input signal A, coupled to driver 63, is used as the charge pump clock. The outputs of each measurement circuit (FSDEC, RSDEC) are used as the charge pump decrement signals. Additionally, signal A is processed through an inverter to form signal ABAR. ABAR is processed through a buffer to form a buffered version of signal A as signal ABUFF. As shown, ABAR and ABUFF are utilized as respective clock inputs to charge pumps 61 and 62. If the decrement signal (FSDEC, RSDEC) is logic '1' on the rising edge of the A signal, a small amount of charge is removed from a capacitor storing the bias voltage signal. If the decrement signal (FSDEC, RSDEC) is logic '0' on the rising edge of the A signal, a small amount of charge is added to a capacitor storing the bias voltage.

Figure 7:
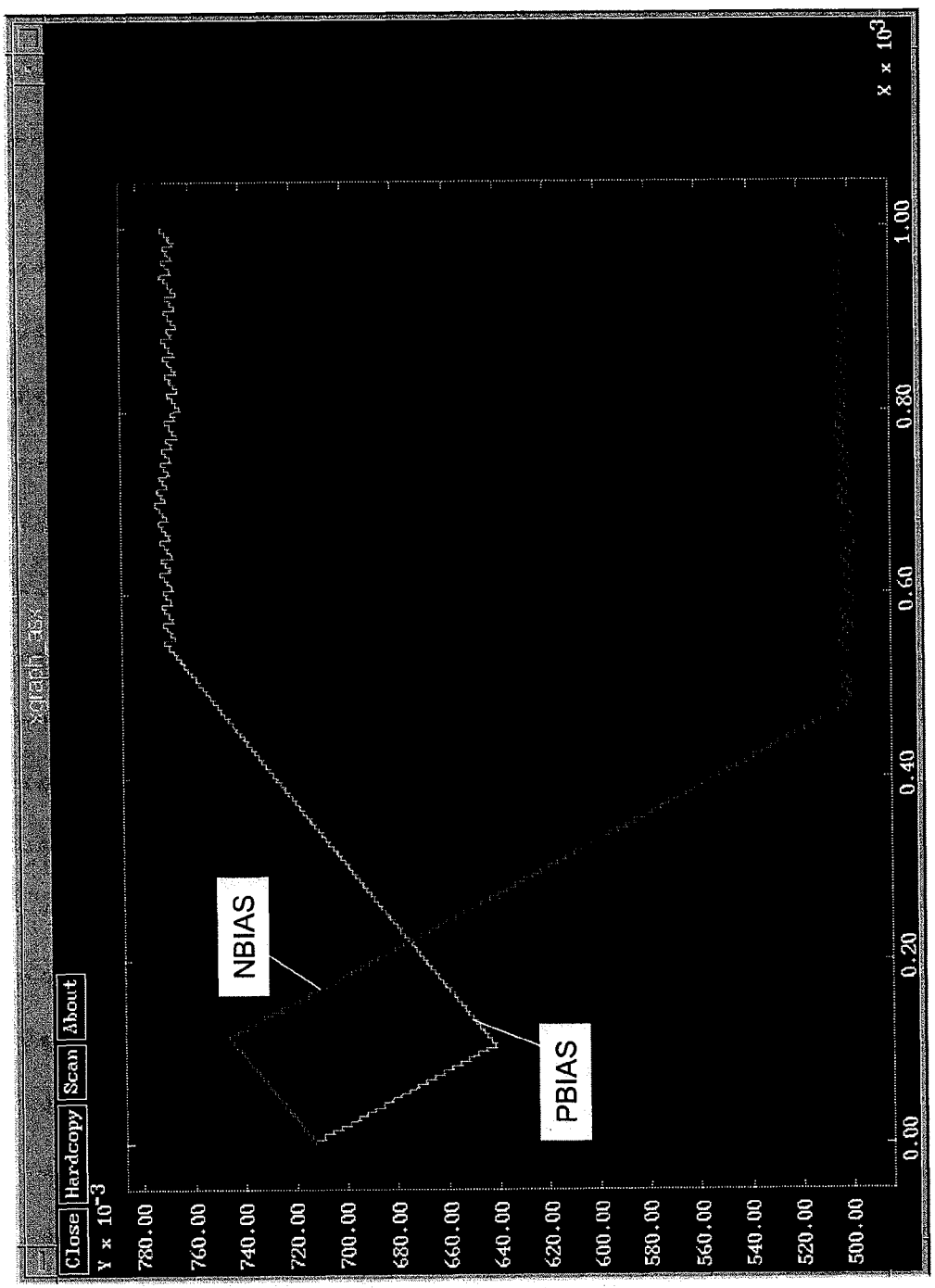
FIG. 7 illustrates a plot of PBIAS and NBIAS as a function of time.

A plot of PBIAS and NBIAS as a function of time is shown in FIG. 7. As illustrated, the system converges on the target rise/fall time. The compensation circuitry samples and compensates PBIAS/NBIAS while the driver continuously switches. When the system converges, the bias voltage varies minimally around the target operating point. As shown in FIG. 7, from time 0 ns to 170 ns the feedback system compensates in the reverse direction (as expected). This occurs during system startup due to the time required for the DLL/Delay line to lock on the target propagation delay (Tprop).

Figure 8:
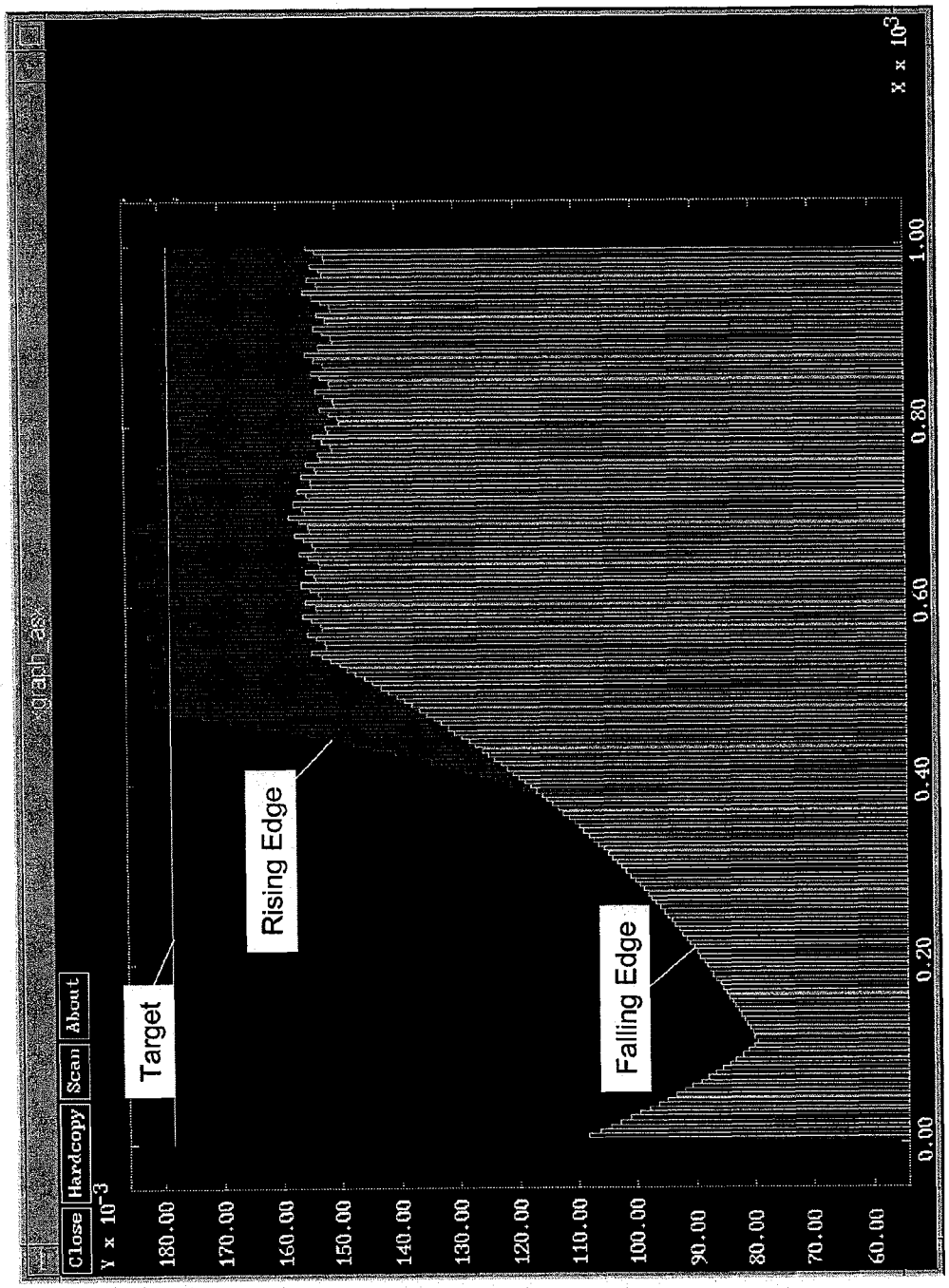
FIG. 8 illustrates a plot of driver output (PAD) rise and fall time as a function of time.

A plot of the driver output (PAD) rise and fall time as a function of time is illustrated in FIG. 8. The vertical scale is in picoseconds and horizontal scale is microseconds. Time "Target" represents the target driver output rise and fall time. "Rising edge" represents the measured driver output rise time, while "Falling edge" represents the measured driver output fall time. The driver continuously switches and the compensation circuitry samples and compensates on every PAD transition which permits adjustment to a changing load. For the particular PVT corner modeled in this analysis, the rise time is compensated to within picoseconds of the target. The fall time, is within the target by approximately 20 picoseconds.

In accordance with a detailed circuit model of the invention, the system can control driver output rise/fall time within +/−100 ps. Contributions to this tolerance value result from the delay line variations, delay skew between the amplifiers that sense the PAD transitions through reference voltages (VREFL and VREFH), and variation in reference voltages (VREFL and VREFH). Additionally, the phase detector switch point does depend on PVT.

Design Structure

Figure 9:
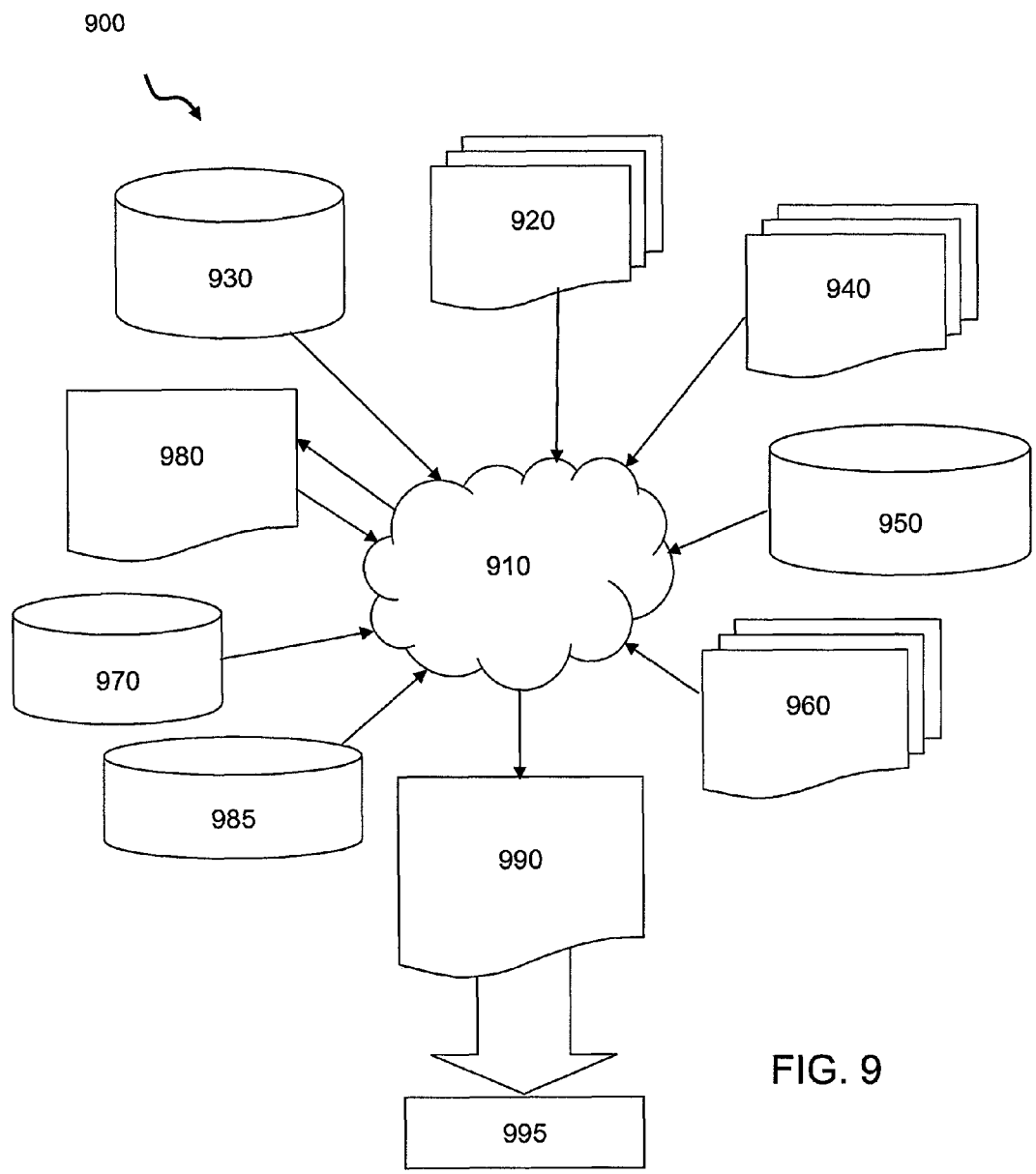
FIG. 9 is a flow diagram of a design process used in semiconductor design, manufacture, and/or test.

FIG. 9 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIGS. 4 and 6 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, for example, FIGS. 4 and 6. Design process 910 preferably synthesizes (or translates) an embodiment of the invention as shown in, for example, FIGS. 4 and 6 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIGS. 4 and 6, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIGS. 4 and 6. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of particular circuit embodiments, those skilled in the analog circuit art will recognize that the invention can be practiced with modifications and in the spirit and scope of the appended claims.

What is claimed:

1. A method in a computer-aided design system for generating a functional design model of a structure for time based driver output transition rate compensation, the method comprising:
    generating, by a processor, a functional representation of a driver circuit having an input signal and an output signal, the driver circuit structured and arranged to control the slew rate of the output signal;
    generating a functional representation of a delay circuit coupled to the output signal of the driver circuit, the delay circuit having a delay proportional to a desired target slew rate of the output signal;
    generating a functional representation of a first comparator for detecting when the output signal rises through a specified level;
    generating a functional representation of a second comparator for detecting when the output signal falls through a second specified level; and
    generating a functional representation of a phase detector directly coupled to outputs of the first and second comparators and directly coupled to an output of the delay circuit, for aligning the phases (voltage-time relationships) of the comparator outputs with the phases of delayed comparator outputs by adjusting the slew rate of the output signal.

2. The method of claim 1, wherein the functional design model comprises a netlist.

3. The method of claim 1, wherein the functional design model resides on storage medium as a data format used for the exchange of layout data of integrated circuits.

4. The method of claim 1, wherein the functional design model resides in a programmable gate array.

5. The method of claim 1, further comprising a current limited inverter scheme comprising two current sources, for adjusting the slew rate of the output signal by controlling current through a prior stage.

6. The method of claim 5, wherein the driver circuit compensates the slew rate of the output signal based on an error signal proportional to a difference between a measured driver output transition time and a time reference for a target driver output transition time by adjusting the measured transition time to the time reference, whereby the measured transition time corresponds to a driver output transition time of the prior stage.

7. The method of claim 1, wherein one of the outputs of the first and second comparators is delayed by the delay circuit to provide an edge triggered digital error signal.

8. The method of claim 7, further comprising at least one charge pump coupled to receive the edge triggered digital error signal, wherein the at least one charge pump generates bias signals for the driver circuit to control the slew rate of the output signal.

9. The method of claim 1, wherein the phase detector is directly coupled to inverted outputs of the first and second comparators.

10. The method of claim 9, wherein the phase detector is directly coupled to an inverse of the input signal and directly coupled to a buffered version of the input signal.

11. The method of claim 10, wherein the phase detector comprises:
    a first latch directly coupled to an output of the first comparator, directly coupled to the output of the delay circuit, and directly coupled to an inverted output of the first comparator; and
    a second latch directly coupled to an output of the second comparator, directly coupled to the output of the delay circuit, and directly coupled to an inverted output of the second comparator.

12. The method of claim 11, wherein the phase detector further comprises:
    a first NAND gate directly coupled to the output of the delay circuit and directly coupled to the inverse of the input signal; and
    a second NAND gate directly coupled to the output of the delay circuit and directly coupled to the buffered version of the input signal.

13. A method in a computer-aided design system for generating a functional design model of a structure for time based driver output transition rate compensation, the method comprising:
    generating, by a processor, a functional representation of a delay circuit connectable to an output signal of a driver circuit, the delay circuit being tunable to establish a time reference;
    generating a functional representation of a device to measure the transition rate for the rising and falling edges of the output signal;

generating a functional representation of a device to compare the measured transition rate to the time reference;

generating a functional representation of a control device structured and arranged to control an output slew rate of the driver circuit; and generating a functional representation of a current limited inverter scheme comprising two current sources, arranged to adjust the output slew rate by controlling current through a prior stage.

14. The method of claim 13, further comprising at least one charge pump coupled to the device to compare the measured transition rate to the time reference, the charge pump being structured and arranged to generate bias signals.

15. The method of claim 14, wherein the control device is coupled to the at least one charge pump that is structured and arranged to receive the bias signals.

16. The method of claim 13, wherein the control device compensates the driver circuit based on an error signal proportional to a difference between the measured transition rate and the time reference by adjusting the measured transition rate to the time reference, whereby the measured transition rate corresponds to an output transition rate of the prior stage.

17. The method of claim 13, wherein the functional design model comprises a netlist.

18. The method of claim 13, wherein the functional design model resides on storage medium as a data format used for the exchange of layout data of integrated circuits.

19. The method of claim 13, wherein the functional design model resides in a programmable gate array.

20. A method in a computer-aided design system for generating a functional design model of a structure for time based driver output transition rate compensation, the method comprising:

generating, by a processor, a functional representation of a driver circuit having an input signal and an output signal, the driver circuit structured and arranged to control the slew rate of the output signal;

generating a functional representation of a delay circuit coupled to the output signal of the driver circuit, the delay circuit having a delay proportional to a desired target slew rate of the output signal;

generating a functional representation of a first comparator for detecting when the output signal rises through a specified level;

generating a functional representation of a second comparator for detecting when the output signal falls through a second specified level; and generating a functional representation of a phase detector coupled to outputs of the first and second comparators and to an output of the delay circuit, for aligning the phases (voltage-time relationships) of the comparator outputs with the phases of delayed comparator outputs by adjusting the slew rate of the output signal, wherein the phase detector is coupled to inverted outputs of the first and second comparators.

* * * * *